United States Patent

Schimmang

(10) Patent No.: US 6,822,160 B2
(45) Date of Patent: Nov. 23, 2004

(54) CONTACT ASSEMBLY FOR ELECTROMAGNETIC SHIELDING

(75) Inventor: Horst Schimmang, Cologne (DE)

(73) Assignee: W.A.S. Technologies GmbH, Nordhorn (DE)

( * ) Notice: Subject to any disclaimer, the term of this patent is extended or adjusted under 35 U.S.C. 154(b) by 0 days.

(21) Appl. No.: 10/700,370

(22) Filed: Nov. 3, 2003

(65) Prior Publication Data

US 2004/0150935 A1 Aug. 5, 2004

(30) Foreign Application Priority Data

Nov. 4, 2002 (DE) .......................................... 102 51 510

(51) Int. Cl.[7] .................................................. H05K 9/00
(52) U.S. Cl. .................................... 174/35 R; 361/818
(58) Field of Search ......................... 174/35 R, 35 GC; 361/752, 753, 799, 800, 816, 818; 220/810, 820, 849

(56) References Cited

U.S. PATENT DOCUMENTS

| | | | | |
|---|---|---|---|---|
| 4,370,831 A | * | 2/1983 | Hamilton | 49/477.1 |
| 5,004,866 A | * | 4/1991 | Cooke et al. | 174/35 GC |
| 5,223,670 A | * | 6/1993 | Hogan et al. | 174/35 MS |
| 5,585,599 A | * | 12/1996 | Schwenk et al. | 174/35 R |
| 5,691,503 A | * | 11/1997 | Kato | 174/35 R |
| 6,303,854 B1 | * | 10/2001 | Papaleo et al. | 174/35 R |

\* cited by examiner

Primary Examiner—Dean A. Reichard
Assistant Examiner—Carmel Oliva
(74) Attorney, Agent, or Firm—Lawrence G. Fridman

(57) ABSTRACT

A contact structure is provided in an electromagnetic shielding, by which the interior of a housing is electromagnetically shielded from the outside. The "housing" in this context can be a building, a living or work container, a living or working unit in the form of a container, a vehicle body, or other structure comprising an inner space. The housing has walls, at least one opening in one of the walls and a closing element adapted to optionally open and close this opening. The housing and the closing element each have an electrically conductive shielding layer. The contact structure serves to establish electric contact between the shielding layers of the housing and the closing element. The contact structure comprises electric contact means at one of the parts, either the wall or the closing element, conductively connected to the conductive layer of this part. The contact means, when the opening is closed by the closing element, extends around the opening for establishing electric contact between the conductive layer of this one part with the conductive layer of the other one of the parts. This one of said parts has a circumferential groove in an end face around the opening. This groove having inwardly projecting longitudinal ledges, whereby a circumferential cavity is defined by the groove and the ledges. This cavity is open through a slot between the ledges. The ledges are recessed at, at least, one location along the slot to define an opening wider than the slot to permit insertion of the contact means therethrough. The contact means have side portions which, after such insertion and longitudinal displacement in the cavity, are held in place by the ledges.

8 Claims, 5 Drawing Sheets

CONTACT ASSEMBLY FOR ELECTROMAGNETIC SHIELDING

The invention relates to a contact structure in an electromagnetic shielding, by which the interior of a housing is electromagnetically shielded from the outside.

The "housing" according to this invention can be a building, a living or work container, a living or working unit in the form of a container, a vehicle body, or other structure comprising an inner space. The invention relates to such a housing which is provided with an electrically conductive layer. Typically the walls of the housing may have aluminium slabs forming the surfaces of the walls and being separated by, for example, a heat- and sound insulating intermediate layer. Aluminium profiles are provided at the edges and end faces of the wall parts electrically conductively connected to the aluminium slabs.

Very often it is necessary to "electrically shield" an inner space. The entering of electromagnetic fields into the inner space of the housing from the outside shall be prevented. Such fields can disturb instruments, for example measuring instruments, which are used in the inner space. This leads to malfunctioning or wrong measurement results. Such an electromagnetic shielding is achieved by an electrically conductive layer on the wall. Such electromagnetic fields, however, can undesirably enter through openings, for example doors or window openings, into the inner space. These openings are closed by appropriate closing elements, such as doors, windows, flaps or the like. These closing elements are also provided with an electrically conductive layer. In order to achieve electromagnetic shielding, it is necessary to conductively connect these electrically conductive layers of the closing elements with the electrically conductive layer of the wall without interruptions. Some sort of "electromagnetic seal" is required.

It is known to glue, screw or clamp contacts between the wall and the closing element. The known ways of fixing are expensive and unsafe.

It is an object of the invention to provide a simply assembled contact assembly of the above mentioned kind for the electric connection of conductive layers of the wall and a closing element of the housing.

To this end, a contact structure is provided in an electromagnetic shielding, by which the interior of a housing is electromagnetically shielded from the outside. The housing has walls, at least one opening in one of the walls and a closing element adapted to optionally open and close this opening. The housing and the closing element each have an electrically conductive shielding layer. The contact structure serves to establish electric contact between the shielding layers of the housing and the closing element. The contact structure comprises electric contact means at one of the parts, either the wall or the closing element, conductively connected to the conductive layer of this part. The contact means, when the opening is closed by the closing element, extends around the opening for establishing electric contact between the conductive layer of this one part with the conductive layer of the other one of the parts. This one of said parts has a circumferential groove in an end face around the opening. This groove having inwardly projecting longitudinal ledges, whereby a circumferential cavity is defined by the groove and the ledges. This cavity is open through a slot between the ledges. The ledges are recessed at, at least, one location along the slot to define an opening wider than the slot to permit insertion of the contact means therethrough. The contact means have side portions which, after such insertion and longitudinal displacement in the cavity, are held in place by the ledges.

The contact means are therefore form-fittingly held in the circumferential groove by the inwardly projecting ledges of the circumferential groove. No glueing or screwing operations are required. The inserting of the contact means into the circumferential groove is achieved by recesses, for example millings, through which the contact means can be inserted into the circumferential groove.

In a preferred embodiment of the invention the conductive layers of the wall and of the closing element are formed on the surfaces of the wall and the closing element, respectively. The circumferential groove is formed in such a conductive surface of one part, for example the closing element. The contact means resiliently engage the conductive surface of the other part, for example the wall, when the closing element is closing the opening. The electric contact is then easily established by contacting the contact means to the conductive surface of the parts.

The contact means are preferably formed by a strip-shaped profile from resilient, electrically conductive material guided in the circumferential groove with a foot portion retained by the ledges of the circumferential groove. The profile is provided with a curved contact portion attached to one side of the foot portion and projecting from the circumferential groove with its free end. Preferably the curved contact portion has a bell-shaped cross section.

The foot portion may be a continuous sheet steel strip while the curved contact portion attached thereto is divided in individual sections by transverse cuts, the individual sections being connected by the continuous sheet steel strip. Thereby the individual sections can individually contact the contact surfaces of the other part and compensate for possible unevenness of those contact surfaces.

Typically the opening is a rectangular door- or window opening. A recess for inserting the contact means is provided in each longitudinal and transversal edge of the door- or window opening or door or window, respectively. The contact means are formed by a contact strip for each longitudinal or transversal edge.

Preferably complementary profile elements are provided around the opening and the closing element, the profile elements having end faces facing each other, when the opening is closed, which form an angle with the surfaces of the housing or the closing element, respectively. The circumferential groove is provided in one of these inclined end faces, while the contact means resiliently engage the other one of these inclined surfaces. Thereby one component of the closing force of the closing element acts on the contact means when the opening is closed.

Embodiments of the invention are described in greater detail hereinbelow with reference to the accompanying drawings.

Figure 1:
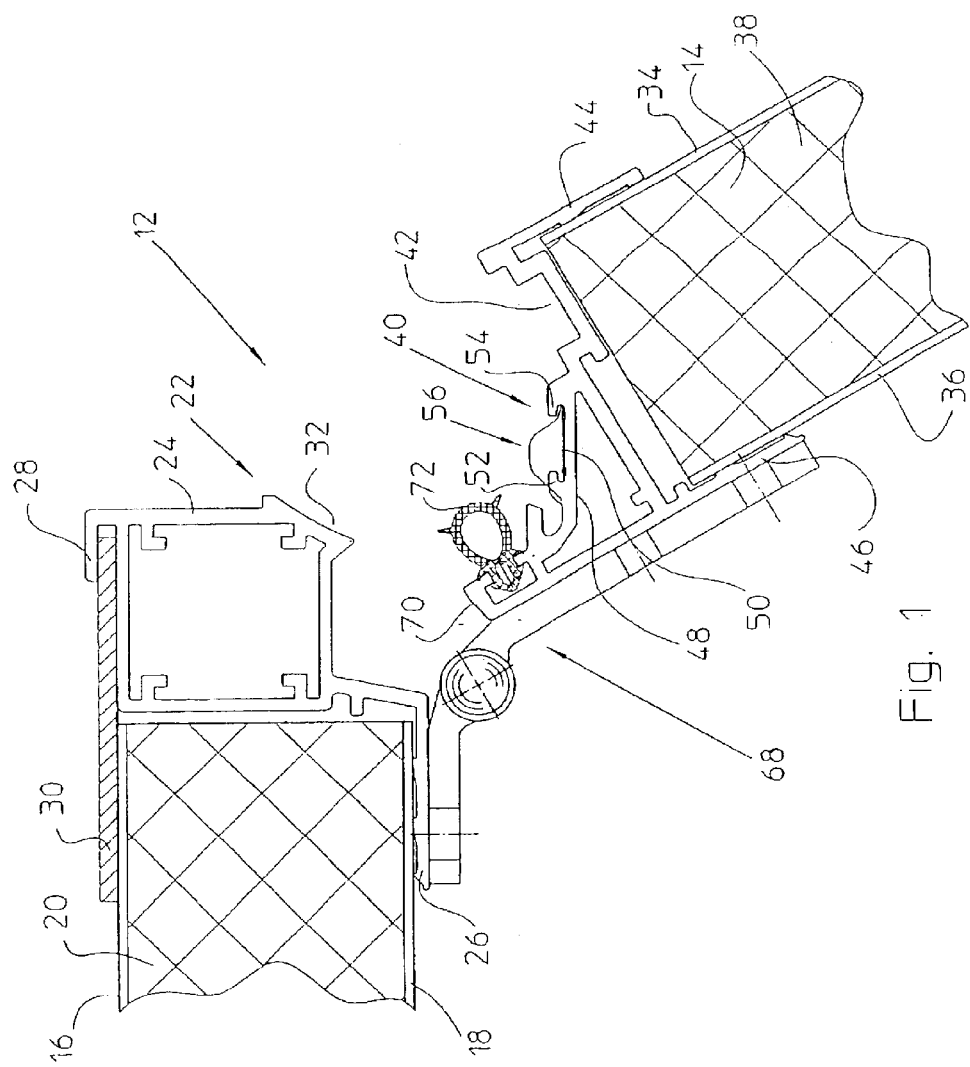
FIG. 1 shows a door in a wall with a contact assembly in an open state.
Figure 2:
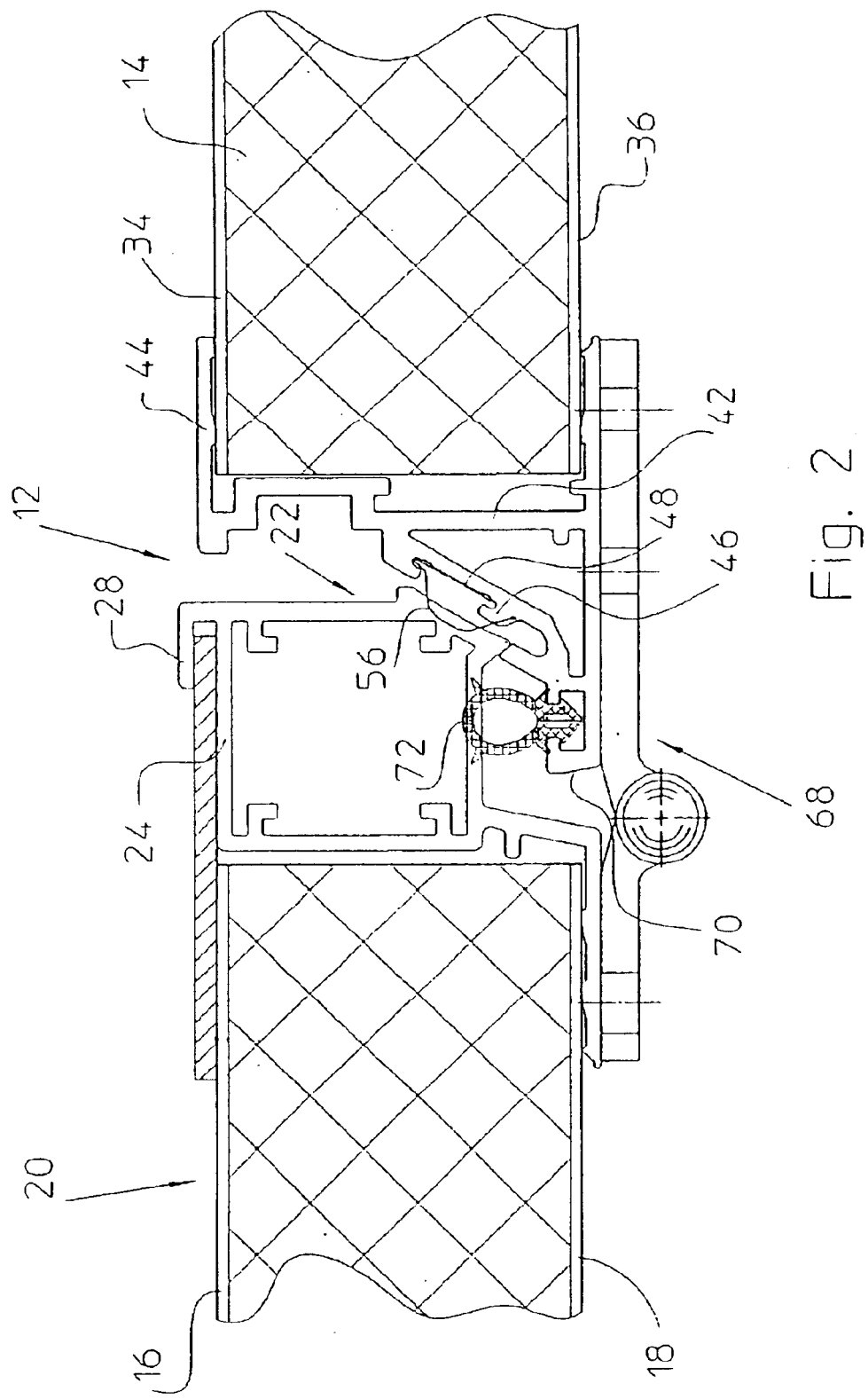
FIG. 2 shows the door of FIG. 1 in a closed state.

Referring to FIGS. 1 and 2, numeral 10 designates a portion of a wall. A door opening 12 is provided in the wall 10. The door opening 12 can be closed by a door 14. The wall is formed in a sandwich-type building art with surface slabs 16 and 18 of an electrically conductive material, preferably aluminum, and an insulating layer 20 therebetween. A profile 22 which is also made of aluminum is mounted around the door opening 12. The profile 22 has a main portion 24 with a generally square shape. On the outside of the profile 22 an L-shaped edge portion 26 is formed as an integral part extending over the edge of the outer aluminum slab 18 and in electrical contact therewith. On the inside, the profile 22 forms an u-shaped, longitudinal groove 28. A ledge 30 is held within the longitudinal groove 28, the ledge adjoining the inner slab 16 of the wall 10.

At its outer edge facing the door opening 12 the profile 22 forms a contact surface 32 forming an angle of about 45° with the surface of the wall 10. The door 14 can close the door opening 12. Similar to the wall 10 the door 14.has two aluminium slabs 34 and 36. An insulating layer 38 is provided between the aluminium slabs. The door 14 is framed along its edges by a profile 40 of high conductivity material, such as aluminum.

The profile 40 has a frame portion 42 adjoining at the front surfaces of the sandwich structure along the side edges and the upper and lower edge of the door. On its inner side a rim ledge 44 extends over and engages the rim of the aluminium slab 34. On its outer side a rim ledge 46 extends on both sides of the frame portion and perpendicular thereto. A part of the outer rim ledge 46 extends over and also engages the edge of the aluminium slab 36. An inclined ledge 48 extends between the frame portion 42 and the other wall side part of the outer rim ledge 46. A shallow circumferential groove 50 is formed in the ledge 48. The circumferential groove 50 in the ledge 48 extends along the entire circumference of the door 14. The circumferential groove 50 has inwardly projecting ledges 52 and 54.

Contact means, generally designated by numeral 56, are retained in the circumferential groove 50. As can be seen best in FIG.3, the contact means 56 are formed by a strip-shaped profile from resilient electrically conductive material, for example a copper-beryllium-alloy, which is guided in the circumferential groove 50 with a foot clement 58 and retained by the ledges 52 and 54 of the circumferential groove 50 and is provided with a curved contact portion 60 attached to one side of 62 of the foot element and projecting from the circumferential groove 50 with its free end 64. The curved contact portion 60 has a bell-shaped cross section. The foot element 58 forms a continuous sheet steel strip. The curved contact portion 60 attached thereto is divided into individual sections by transverse cuts 66 (FIG. 5), the individual sections being connected by the continuous sheet steel strip of the foot element 58.

Figure 3:
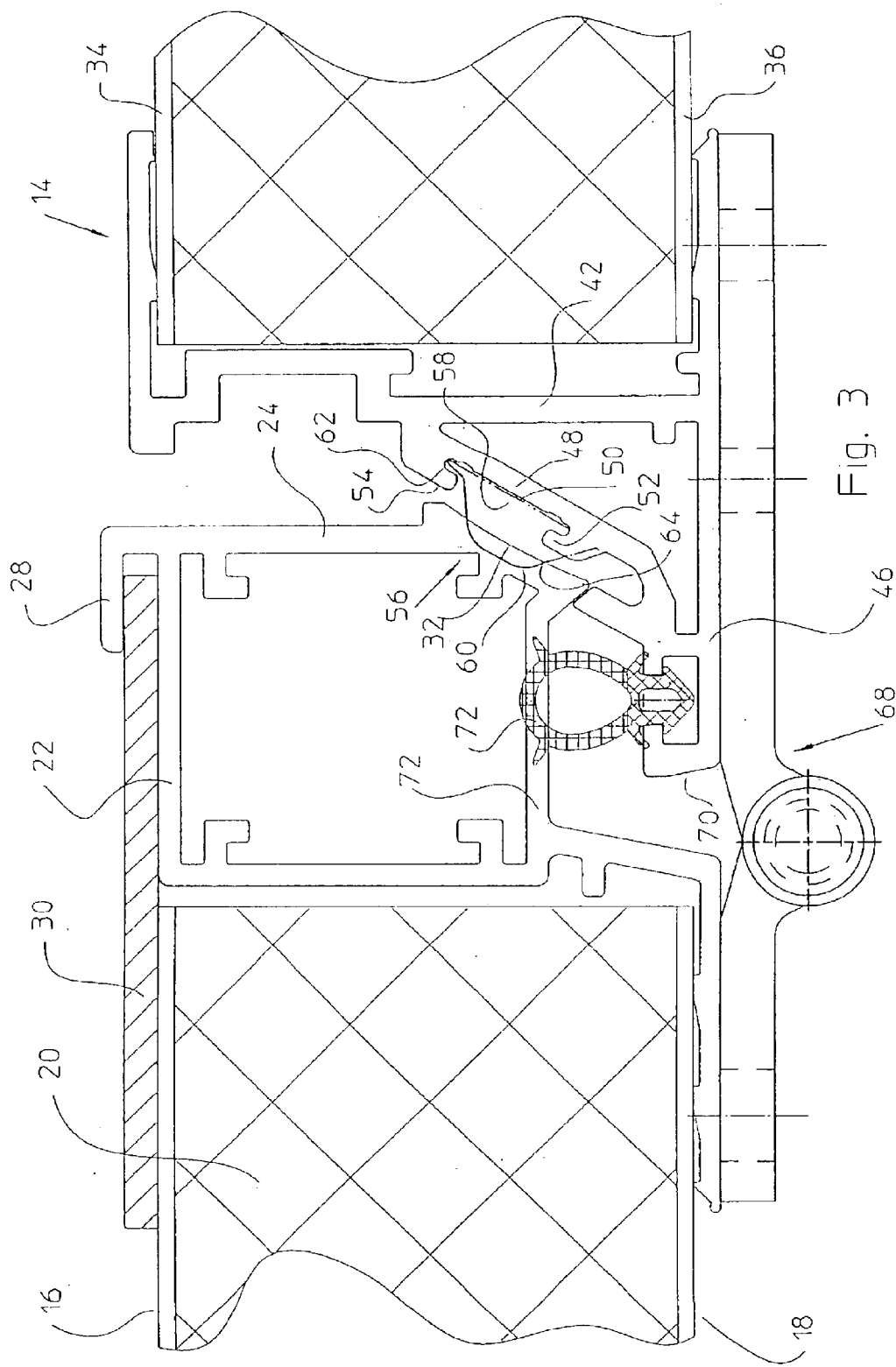
FIG. 3 shows the contact assembly at an enlarged scale

The door 14 is pivotally connected to the wall 10 by ordinary door hinges 68. The profile 40 of the door 14 is provided with a ledge 70 with a tongs-like cross section. A resilient seal 72 is retained in this tongs-like ledge 70. When the door 14 is closed as shown in FIG. 2 and FIG. 3 the seal 72 seals the outer longitudinal surface of the main portion 24 of the wall-side profile 22 and effects the sealing of the door.

Figure 4:
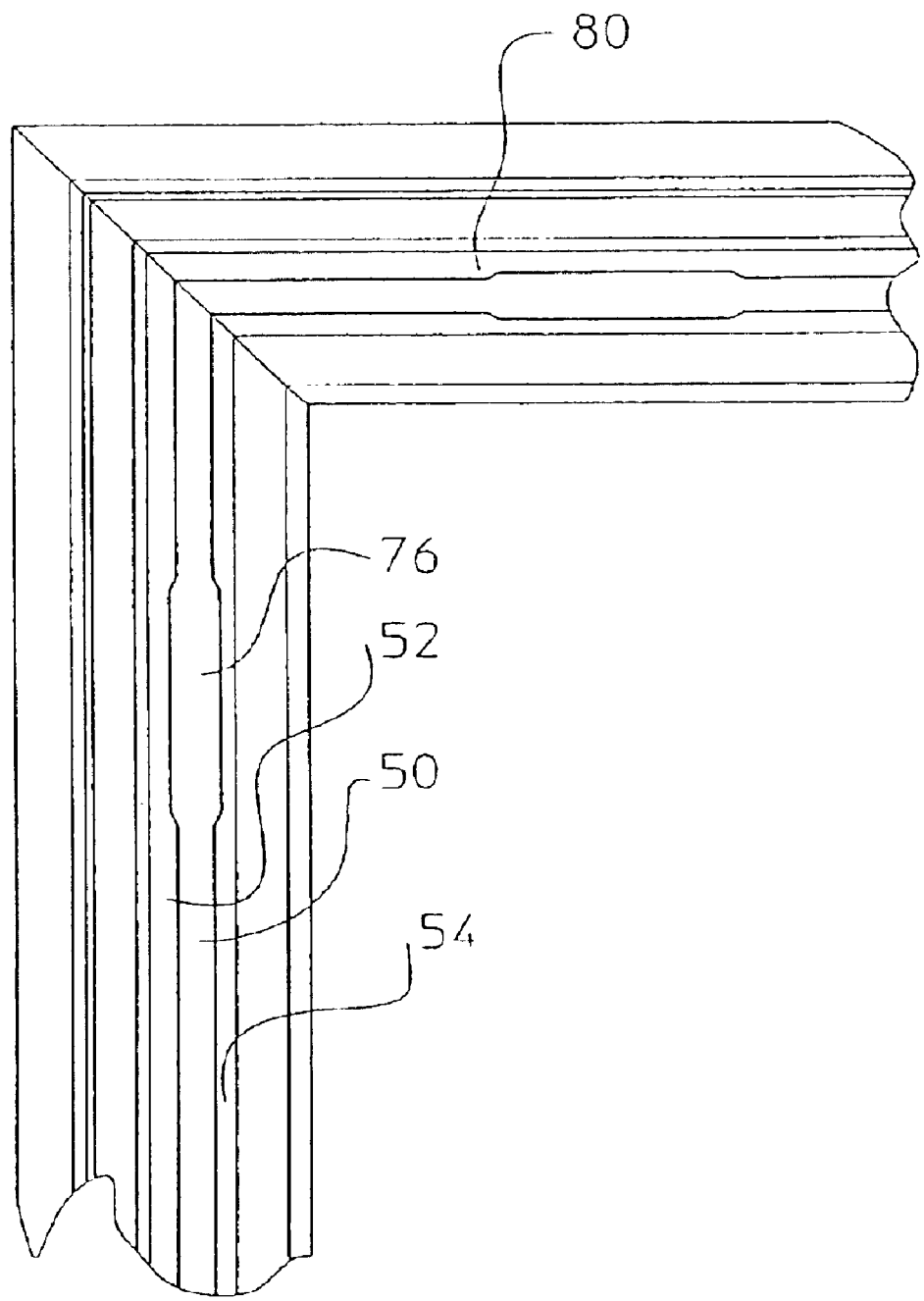
FIG. 4 shows the profile of the door with a circumferential groove provided with recesses for receiving the contact assembly
Figure 5:
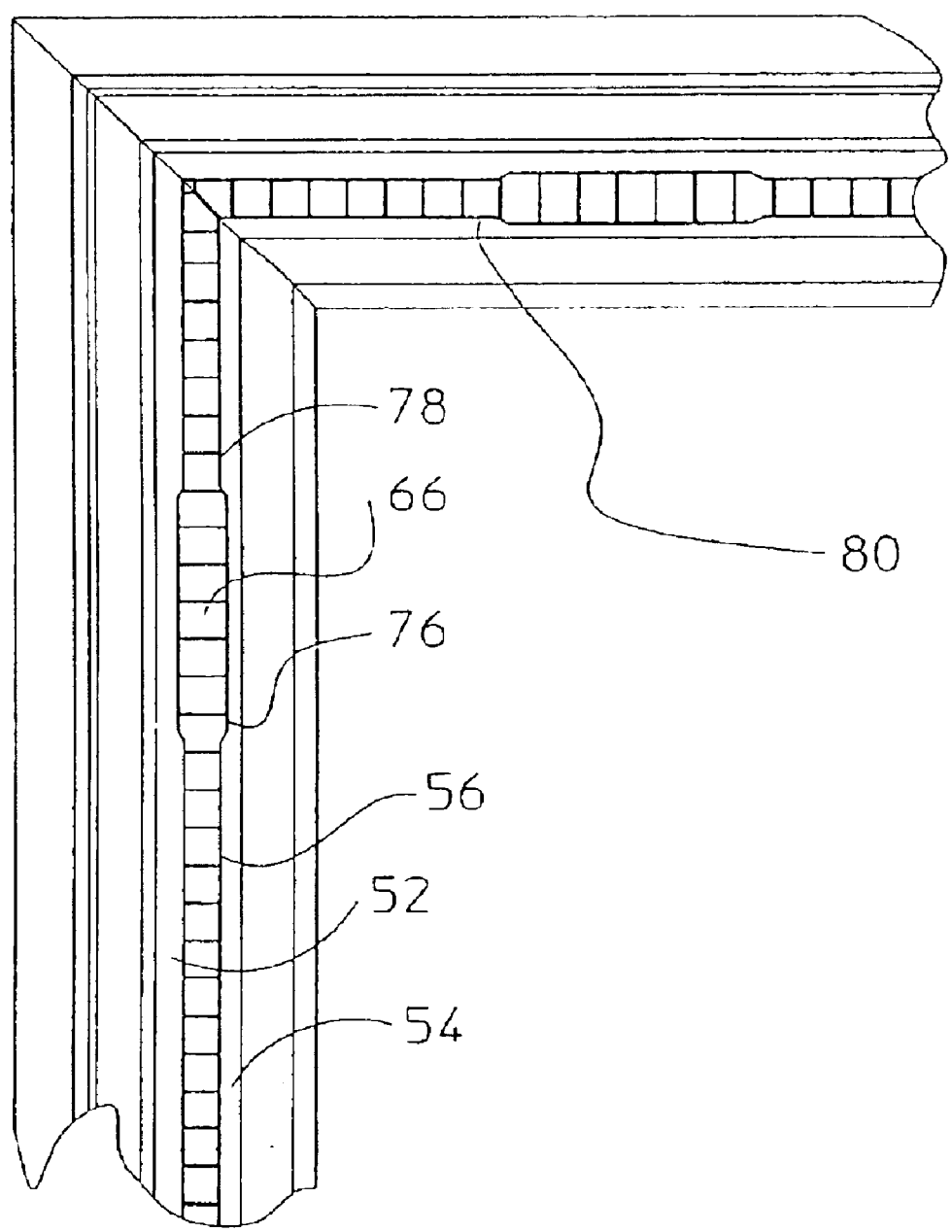
FIG. 5 shows the profile of FIG. 4 with inserted contact means.

As can be seen from FIG. 4, the circumferential groove 50 running around the door 14 with the projecting ledges 52 and 54 has recesses 76 extending over a section of the circumferential groove 50. This can be milled cuts, wherein the ledges 52 and 54 are cut out entirely or partly along this section. These recesses 76 permit inserting of the strip-shaped contact means 56 into the circumferential groove 50 behind the projecting ledges 52 and 54. If, as in the present case, the openings of the housing are rectangular door- or window openings, one recess for inserting the contact means 56 is provided in each longitudinal and transversal edge of the door- or window opening, the contact means 56 being formed by a contact strip 78 or 80, respectively, for each longitudinal or transversal edge. In FIG. 5 the described, inserted contact means 56 are shown with transverse cuts 66.

In the described embodiment complementary profiles 22 and 40 are provided at the edge of the opening 12 and the closing element closing the opening 12, i.e. the door 14. The profiles have inclined surfaces 32 and 48 facing each other. The inclined surfaces face each other and form an angle with the surfaces of the housing 10 or the door 14, respectively, when the opening is closed. The circumferential groove is provided in one of these inclined surfaces, that is in the inclined running ledge 48. The contact means 56 resiliently engage the other one of these inclined surfaces, i.e. the surface 32.

The contact means 56 are form-fittingly and safely held by the profile 40. Additional operations, such as glueing or screwing are not necessary. When the door 14 is closed (FIG. 2 and FIG. 3) the contact part 60 is resiliently pressed flat. The contact part 60 therefore establishes a safe contact with the surface 32. Simultaneously the foot element 50 is held in safe contact with the bottom of the circumferential groove 50. The surface 32 forms part of the electrically conductive profile 22, which in turn is in electric contact with the aluminum slab 18 of the wall 10. Also, the circumferential groove 50 is part of the profile 40 which is in electrically conductive contact with the aluminum slab 36 of the door. Therefore the electrically conductive layer of the door 14 with the profile 40 is connected to the electrically conductive layer of the wall with the profile 22 all around through the described contact assembly. A closed electrically conductive layer or surface of the housing is generated all around. This results in a virtually perfect electromagnetic shielding.

In the described embodiment the contact assembly is mounted at a door, i.e. at the closing element. However, the contact assembly can obviously also be mounted in a similar way at the housing along the inner edges of the opening, i.e. the door frame or the door opening.

I claim:

1. A contact structure in an electromagnetic shielding, by which the interior of a housing is electromagnetically shielded from the outside, said housing having walls, at least one opening in one of said walls and a closing element adapted to optionally open and close said opening, said housing and said closing element each having an electrically conductive shielding layer, said contact structure serving to establish electric contact between the shielding layers of said housing and said closing element, said housing representing a first part, and said closing element representing a second part, said contact structure comprising electric contact means at one of said parts conductively connected to said conductive layer of said part, said contact means, when said opening is closed by said closing element, extending around said opening for establishing electric contact between said conductive layer of said one part with said conductive layer of the other one of said parts, wherein said one of said parts has a circumferential groove in an end face around said opening, said groove having inwardly projecting longitudinal ledges, whereby a circumferential cavity is defined by said groove and said ledges, said cavity being open through a slot between said ledges, said ledges being recessed at, at least, one location along said slot to define an opening wider than said slot to permit insertion of said contact means therethrough, said contact means having side portions which, after such insertion and longitudinal displacement in said cavity, are held in place by said ledges.

2. A contact assembly as claimed in claim 1, wherein said opening defines end faces of said wall around said opening, and said closing element has end faces around said closing element, said end faces of said wall and said closing element facing each other, when said opening is closed by said closing element, said shielding conductive layers representing the surfaces of said wall and of said closing element, respectively, including said end faces thereof, said circumferential groove being formed in such end face conductive layer surface of said one part, said contact mean resiliently engaging said end face conductive layer surface of the other one of said parts.

3. A contact assembly as claimed in claim 2, wherein said contact means comprise at least one profiled parts of resilient, electrically conductive material said profiled parts having a strip-shaped foot portion and a curved contact portion attached thereto, said foot portion being guided in said circumferential groove and retained by said ledges of said circumferential groove, said curved contact portion extending through said slot and having a resilient free end projecting from said circumferential groove.

4. A contact assembly as claimed in claim 3, wherein said curved contact portion has a bell-shaped cross section.

5. A contact assembly as claimed in claim 3, wherein said foot is a continuous sheet steel strip, the curved contact portion attached thereto being divided into individual sections by transverse cuts, said individual sections being interconnected by said continuous sheet steel strip.

6. A contact assembly as claimed in claim 1, wherein said housing is a container, said opening being a rectangular door or window of said container, said circumferential groove and ledges having four sections along the four sides of said rectangular door or window.

7. A contact assembly as claimed in claim 6, wherein said ledges of each of said groove and ledges sections have recessed locations for insertion of said contact means and said contact means comprise one continuous contact strip for each of said groove and ledges section.

8. A contact assembly as claimed in claim 1, wherein said end faces of said wall and of said closing element around said opening are formed by substantially complementary conductive profile elements, said profile elements having inclined surfaces facing each other and forming an angle with the surfaces of said wall or said closing element, respectively, and said circumferential groove is provided in one of these inclined surfaces and said contact means resiliently engage the complementary one of said inclined surfaces.

\* \* \* \* \*